(12) United States Patent
Farassat

(10) Patent No.: US 6,905,058 B2
(45) Date of Patent: Jun. 14, 2005

(54) BONDING TOOL AND WIRE BONDER

(75) Inventor: Farhad Farassat, Taufkirchen (DE)

(73) Assignee: F&K Delvotec Bondtechnik GmbH, Ottobrunn (DE)

( * ) Notice: Subject to any disclaimer, the term of this patent is extended or adjusted under 35 U.S.C. 154(b) by 66 days.

(21) Appl. No.: 10/464,354

(22) Filed: Jun. 18, 2003

(65) Prior Publication Data
US 2004/0011848 A1 Jan. 22, 2004

(30) Foreign Application Priority Data

Jun. 18, 2002 (EP) .............................. 02013543
Aug. 8, 2002 (EP) ............................. 02017859

(51) Int. Cl.$^7$ .............................................. B23K 1/06
(52) U.S. Cl. ......................... 228/1.1; 228/4.5; 228/13
(58) Field of Search ............................. 228/1.1, 110.1, 228/4.5, 180.5, 13

(56) References Cited

U.S. PATENT DOCUMENTS

| | | | | |
|---|---|---|---|---|
| 3,787,966 A | * | 1/1974 | Klossika ........................ 29/854 |
| 3,954,217 A | * | 5/1976 | Smith ....................... 228/110.1 |
| 4,230,925 A | * | 10/1980 | Lascelles .................... 219/56.1 |
| 4,437,603 A | * | 3/1984 | Kobayashi et al. ........... 228/4.5 |
| 4,597,520 A | * | 7/1986 | Biggs .......................... 228/111 |
| 4,619,397 A | * | 10/1986 | Urban ......................... 228/111 |
| 4,781,319 A | * | 11/1988 | Deubzer et al. ............. 228/4.5 |
| 4,976,392 A | * | 12/1990 | Smith et al. ................ 228/102 |
| 5,018,658 A | * | 5/1991 | Farassat ....................... 228/4.5 |
| 5,067,382 A | * | 11/1991 | Zimmerman et al. ......... 83/879 |
| 5,365,657 A | * | 11/1994 | Brown et al. .................. 29/850 |
| 5,400,503 A | * | 3/1995 | Komoriya et al. ............. 29/850 |
| 5,452,841 A | * | 9/1995 | Sibata et al. ............. 228/180.5 |
| 5,894,981 A | * | 4/1999 | Kelly ........................... 228/104 |
| 6,206,275 B1 | * | 3/2001 | Biggs ........................ 228/180.5 |
| 6,276,588 B1 | * | 8/2001 | Johnson ........................ 228/13 |
| 6,439,448 B1 | * | 8/2002 | Ringler ..................... 228/110.1 |
| 2003/0192414 A1 | * | 10/2003 | Farassat ........................ 83/694 |
| 2004/0011848 A1 | * | 1/2004 | Farassat ....................... 228/1.1 |

FOREIGN PATENT DOCUMENTS

EP          0 649 701 A1    10/1994

\* cited by examiner

*Primary Examiner*—Kiley S. Stoner
(74) *Attorney, Agent, or Firm*—Boyle Fredrickson Newholm Stein & Gratz S.C.

(57) ABSTRACT

Bonding tool for ultrasonic wire bonding, with a knife (3) that is inserted into or closely apposed to the bonding tool so as to be longitudinally movable with respect thereto, in order to cut a projecting part of a bonded wire immediately behind a bonded connection.

19 Claims, 2 Drawing Sheets

BONDING TOOL AND WIRE BONDER

DESCRIPTION

The invention relates to a bonding tool for the ultrasonic bonding of wires as well as to its application in a thick-wire bonder, or to a wire bonder equipped with such a tool.

In the following the term "bonding tool" is used in the narrow sense to designate the element (also often called a bonding "wedge") that transmits ultrasonic energy and compressive force to a wire that is to be bonded by the ultrasonic process. It is also used in a broader sense for a combination of such a tool with a knife that is inserted into or closely apposed to the tool for the purpose of cutting off a projecting section of a bonded wire.

In conventional thick-wire bonders the actual bonding tool for the transmission of pressure and bonding energy—specifically, the so-called "wedge"—and a vertically movable knife for cutting the bonded wire are separate tools, which for structural reasons are disposed on a bonding head at a certain lateral distance from one another. Especially when bonded connections are to be produced in front of a so-called "wall" (i.e., a vertically elevated section of a substrate, structural component or the like), such an arrangement encounters certain difficulties. In particular, a minimal distance must be maintained between such a wall and the bonded connection, so that the separate knife can be introduced in order to cut away the end of the bonded wire that extends beyond the actual connection.

It is the objective of the present invention to make available an improved bonding tool, which in particular allows bonded connections to be made in closer proximity to so-called walls.

This objective is achieved by a bonding tool with the characteristics given in claim 1. Advantageous further developments of the idea underlying the invention will be evident in the dependent claims.

The invention further includes the application of the proposed tool in a thick-wire bonder.

The invention incorporates the fundamental idea of substantially reducing the distance between the actual bonding tool and the knife, the minimal spacing of which has previously been determined by their construction as separate elements. The invention further incorporates the idea that for this purpose the knife can be inserted into the actual bonding tool (wedge), or at least can be closely apposed thereto.

Figure 1:
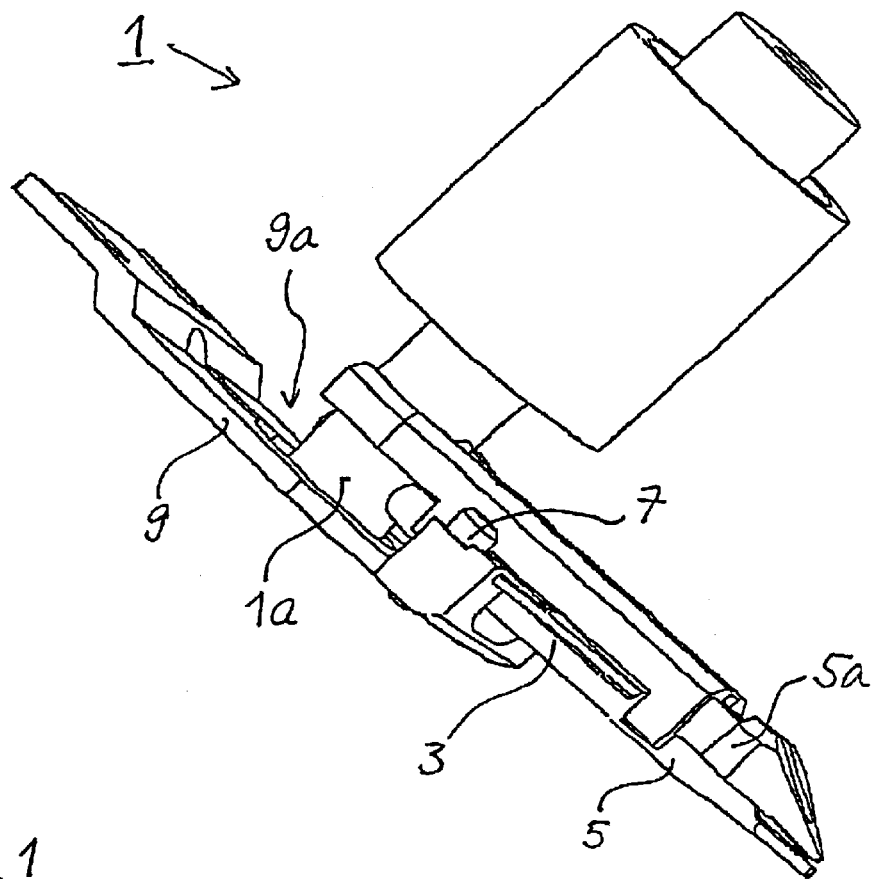
Figure 2A:
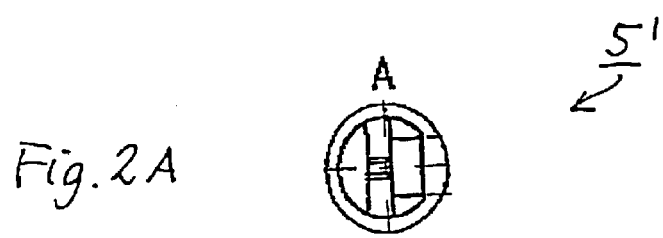
Figure 2B:
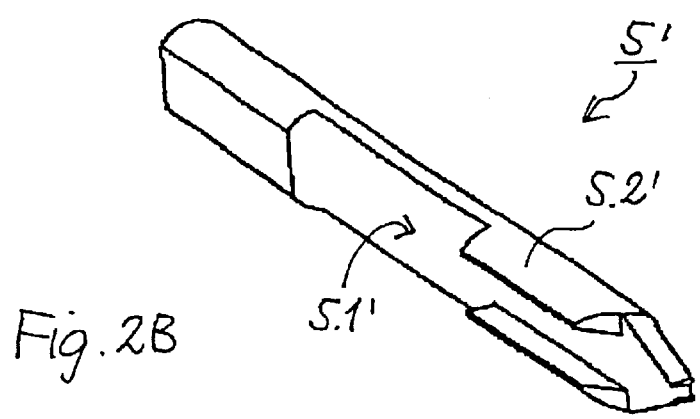
Figure 3:
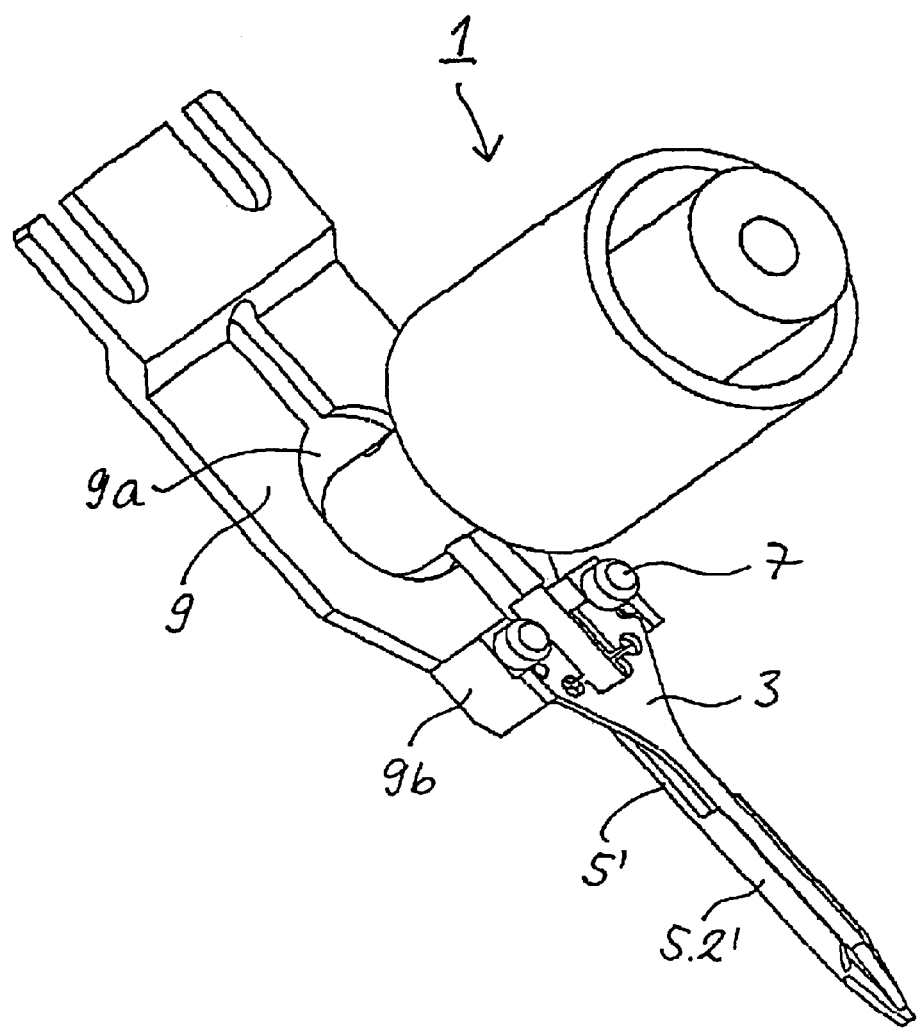

Further advantages and useful features of the invention will be apparent in the following description of preferred exemplary embodiments with reference to the figures, wherein FIG. 1 is a perspective drawing of a first embodiment of the invention, FIGS. 2A and 2B are cross-sectional and perspective drawings, respectively, of a special structural embodiment of a bonding tool (in the narrower sense), and FIG. 3 is a perspective drawing of another embodiment of the invention.

FIG. 1 is shown a tool-holder section 1 of a bonding head according to a first embodiment of the invention, in which a knife 3 has been inserted into a bonding wedge 5 on the side that faces away from the tool-attachment means and the transducer (not shown), in such a way that the knife 3 can be shifted longitudinally. The knife 3 is attached to a knife holder 9 by fixation screws 7, so that its position can be adjusted. The bonding wedge 5 has a U-shaped wire guide 5a, so configured that the knife 3 is enclosed on both sides by projections. A lateral guidance when the knife is moved in the longitudinal direction of the bond wedge is effected by a suitable shape of the bond wedge 5; see FIGS. 2B and 3.

The knife holder 9, the basic shape of which is approximately rectangular, is crimped in the longitudinal direction and in its middle region comprises a slot-like aperture 9a that accommodates a projection 1a of the tool-holder section 1 which extends beyond the longitudinal plane of the bonding wedge 5, thus enabling the knife to move in relation to the tool-holder section without hindrance, by sliding along in close apposition to the bonding wedge.

FIGS. 2A and 2B show a bonding wedge 5', the shape of which is somewhat different from that in the embodiment according to FIG. 1; it is viewed both in cross section (FIG. 2A) and in perspective (FIG. 2B). The innovation with respect to known bonding wedges consists in the presence of an elongated recess 5.1', which in a middle part of the bonding wedge 5' has no side walls, whereas in an adjacent part closer to the tip of the bonding wedge it is delimited by two lateral abutments 5.2' that serve as guides. The lateral abutments 5.2' form a guide section for the vertical guidance of the knife.

In FIG. 3 is shown a second tool-holder section 1' with a knife 3 constructed as already shown in FIG. 1, and with a bonding wedge 5' as shown in FIGS. 2A and 2B. The shapes of the knife 3 and the knife holder 9 are more clearly visible here than in FIG. 1. In this embodiment the knife is guided along the surface of the bonding wedge 5' that faces towards the tool-holder section and transducer. The knife holder 9 thus encloses the bonding wedge 5' by way of a clamp-like fixation section 9b, into which are screwed the fixation screws 7 that keep the knife 3 in position.

Either of the embodiments according to FIG. 1 or FIG. 3, in which the positions of bonding wedge and knife are to some extent reversed, can be employed as appropriate, depending on the specific bonding geometry involved in a particular application. In each case they enable the bonded connections to be positioned closer to sections or components that extend upward from the substrate (the above-mentioned walls), and thus allow the substrate surface to be utilized more efficiently.

What is claimed is:

1. Bonding tool for ultrasonic wire bonding, characterized by a knife (3) that is inserted into a bonding wedge (5; 5') so as to be longitudinally movable with respect thereto, in order to cut a projecting part of a bonded wire immediately behind a bonded connection;

a guide structure operatively connected to the bonding wedge to guide movement of the knife.

2. Bonding tool according to claim 1, characterized by construction of the bonding wedge (5; 5') with a groove (5.1') having a length and by the guide structure including lateral guide abutments (5.2') that extends over at least part of the length, of the groove, for vertical guidance of the knife.

3. Bonding tool according to claim 1, characterized in that the knife (3) is mounted on a crimped knife holder (9), the crimp configuration of which is adapted to the geometry of the bonding wedge and that of a tool-holder section (1) or transducer in such a way that the bonding tool and knife can be moved relative to one another with no interference.

4. Bonding tool according to claim 3, characterized in that the knife (3) is attached to the knife holder by means of a screw or plug connection (7), in particular in such a way that its position can be adjusted.

5. Bonding tool according to claim 1, characterized in that the knife (3) is inserted on the side that faces toward a transducer that actuates the bonding wedge (5; 5').

6. Bonding tool according to claim 1, characterized in that the knife (3) is inserted on the side that faces away from a transducer that holds the bonding wedge (5; 5').

7. Bonding tool according to claim 3 characterized in that the knife holder (9) comprises an aperture (9a) through which passes a holder section (1a) which projects away from the transducer to a point beyond the vertically extending plane of the bonding wedge (5; 5').

8. Bonding tool according to claim 1, wherein the bonding wire is a thick-wire.

9. A bonding tool for ultrasonic wire bonding, comprising:
a bonding wedge for transmitting ultrasonic energy and compressive force to a wire to be bonded; and
a knife that is inserted into the bonding wedge, the knife longitudinally movable with respect to the bonding wedge in order to cut a projecting part of a bonded wire immediately behind a bonded connection.

10. The bonding tool according to claim 9, wherein the bonding wedge includes a groove with lateral guide abutments that extend over at least part of its length, for vertical guidance of the knife.

11. The bonding tool according to claim 9, further comprising a knife holder for holding the knife, the knife holder having a crimp configuration which allows for the bonding wedge and the knife to be moved relative to one another free of interference.

12. The bonding tool according to claim 11, wherein the knife is attached to the knife holder by connection means such that the position of the knife is adjustable.

13. The bonding tool according to claim 9, wherein:
the bonding wedge has first and second sides; and
the knife is inserted on the first side of the bonding wedge toward a transducer for actuating the bonding tool.

14. The bonding tool according to claim 9, wherein:
the bonding wedge has first and second sides; and
the knife is inserted on the second side of the bonding wedge away from a transducer that holds the bonding tool.

15. The bonding tool according to claim 11, wherein the knife holder includes an aperture therethrough; and wherein the bonding tool further comprises a holder section for supporting the bonding wedge, the holder section passing through the aperture in the knife holder.

16. A bonding tool for a thick-wire bonder that transmits ultrasonic energy and compressive force to a wire to be bonded, comprising:
a bonding wedge;
a knife inserted into the bonding wedge for longitudinal movement with respect thereto; and
a guide structure interconnected to the bonding wedge to guide movement of the knife.

17. The bonding tool of claim 16, further comprising:
a tool holder for supporting the bonding wedge; and
a knife holder attached to the knife, the knife holder having a slot-like aperture for accommodating a portion of a tool holder therethrough.

18. The bonding tool of claim 17, wherein the slot-like aperture of the knife holder is of sufficient dimension to enable longitudinal movement of the knife in relation to the tool holder without hindrance.

19. The bonding tool of claim 16, wherein the guide structure includes first and second abutments projecting from the bonding wedge for receiving the knife therebetween.

* * * * *